(12) United States Patent
Maryashin et al.

(10) Patent No.: US 8,774,237 B2
(45) Date of Patent: *Jul. 8, 2014

(54) PULSED LASER SYSTEM WITH SATURABLE ABSORBER

(75) Inventors: Sergey Maryashin, Burbach (DE); Andrey Unt, Burbach (DE)

(73) Assignee: IPG Photonics Corporation, Oxford, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/592,704

(22) Filed: Aug. 23, 2012

(65) Prior Publication Data

US 2012/0314723 A1    Dec. 13, 2012

Related U.S. Application Data

(62) Division of application No. 12/435,248, filed on May 4, 2009, now Pat. No. 8,275,007.

(51) Int. Cl.
*H01S 3/113* (2006.01)

(52) U.S. Cl.
USPC .............................. 372/17; 372/11

(58) Field of Classification Search
USPC ............... 372/10, 11, 12, 13, 14, 15, 16, 17
See application file for complete search history.

(56) References Cited

U.S. PATENT DOCUMENTS

| 3,754,190 | A | * | 8/1973 | Cross ............................ 372/11 |
| 5,799,024 | A | * | 8/1998 | Bowers et al. ................ 372/11 |
| 7,518,787 | B2 | * | 4/2009 | Bykanov et al. ............. 359/333 |
| 8,275,007 | B2 | * | 9/2012 | Maryashin et al. ........... 372/11 |
| 2003/0118060 | A1 | * | 6/2003 | Spuehler et al. .............. 372/18 |
| 2004/0075890 | A1 | * | 4/2004 | Kim et al. .................. 359/341.1 |
| 2005/0129382 | A1 | * | 6/2005 | Sakakibara et al. ......... 385/147 |

OTHER PUBLICATIONS

Derickson et al., "Suppression of Multiple Pulse Formation in External-Cavity Mode-Locked Semiconductor Lasers Using Intrawaveguide Saturable Absorbers," 1992, IEEE Photonics Technology Lett., 4, 4, 333-335.*

* cited by examiner

*Primary Examiner* — Jessica Stultz
*Assistant Examiner* — Joshua King
(74) *Attorney, Agent, or Firm* — Y. Kateshov, Esq.; T. King, Esq.

(57) ABSTRACT

A high power pulsed laser system is configured with at least two gain blocks and with at least one saturable absorber (SA) coupled to the output and input of the respective gain blocks. The SA is configured so that $Qsat\_sa < Qsat\_gb$, wherein $Qsat\_sa$ is a saturation energy of the SA, and $Qsat\_gb$ is a saturation energy of the gain blocks. The SA is further configured with a recovery time $\tau < 1/f$ providing for the substantially closed state of the SA, wherein the f is a pulse repetition rate, and with the recovery time $\tau$ smaller than a round trip time $Tround\_trip = 2*(L1+L2)*n/c$, where L1, L2—lengths of the respective gains gain blocks, n—a refractive index of active media, c—a speed of light in vacuum.

5 Claims, 3 Drawing Sheets

PULSED LASER SYSTEM WITH SATURABLE ABSORBER

CROSS-REFERENCE TO RELATED APPLICATIONS

This is a division of U.S. patent application Ser. No. 12/435,248 filed on May 4, 2009 now U.S. Pat. No. 8,275,007 with the United States Patent and Trademark Office.

BACKGROUND OF THE DISCLOSURE

1. Field of the Disclosure

The disclosure relates to a pulsed, high power optical system. In particular, the disclosure relates to a pulsed multi-cascade fiber optical system configured with at least one passive modulator which is operative to isolate the consecutive gain blocks of the optical system from parasitic optical signals.

2. Prior Art

One of techniques, allowing increasing the energy level of the output optical pulse generated by a pulsed-operated laser system, includes cascading multiple gain blocks or simply amplifiers. The gain factor of the cascaded laser system corresponds to the multiplication of the gain coefficients of all blocks which may be, thus, high. However, the high gain of the output may be unacceptable for the following reasons.

One of the reasons includes the presence of amplified spontaneous emission (ASE) which is proportionally amplified by the gain factor of the system and, thus, may reach unacceptably high levels. The consequences of high levels of noise—the ASE is no more than a useless signal or noise—include, for example, the pronounced inefficiency of a laser system. Still a further consequence is associated with the very presence of the high energy levels of the ASE at the output of the system which may be unacceptable in a variety of laser system's applications. For example, the presence of the high-energy ASE cannot be tolerated in marking sensitive materials, such as plastic.

A further reason explaining detrimental effects of high gain factor to the operation of the pulsed laser system includes a so-called self pulsing phenomenon causing the degradation and possible destruction of amplifiers or gain blocks, particularly those configured from fiber. Still another reason for avoiding high gain relates to a buildup of backreflection unavoidable in practical applications of the system. Concomitantly, backward Rayleigth scattering, Brillouin scattering as well as other scattering noise developed in the cascades and propagating through the laser system also contribute to the degradation of the system.

As a result, as readily realized by one of ordinary skills in the pulsed-operated laser art, the gain blocks should and are typically optically isolated. The means used for isolating cascades are briefly discussed immediately below.

In accordance with one approach, adjacent gain blocks may be mutually isolated by a bulk isolator. The bulk isolator is configured to transmit radiation in one direction and block it in the opposite direction. As a consequence, while the problem with backreflected noise may be adequately addressed, the forward propagation of noise still poses a problem.

The other approach includes the use of active modulators configured to manipulate properties of light beams, such as the optical power or phase. The active modulators include, among others, acousto- and electro-optic modulators. The former, as well known to the artisan, is based on the acousto-optic effect, while the latter exploits the electro-optic effect. The active modulators thus operate as a synchronously timed gate employed between adjacent gain blocks. The active modulators have certain advantageous over bulk isolators. For instance, the forward absorption of the ASE to a subsequent, downstream gain block is prevented, except for a temporary open window of modulator. As a consequence, the resulting noise at the output of the laser system is substantially suppressed. However, the use of active modulators adds significant cost and complexity to the laser system and leads to a less robust and bulkier structure.

One of the solutions of the above-discussed problems includes the use of saturable absorber which is briefly mentioned by W. V Sorin and et al. in a paper titled "Single-mode-fiber saturable absorber" incorporated herein by reference in its entirety. However, to the best knowledge of Applicants, neither the incorporated paper, nor any other known to Applicants source suggests the optimization of the saturable absorber in a multi-cascaded high power laser system.

A need, therefore, exists for providing a cost-effective multi-cascaded pulsed-operated fiber laser system which is provided with an optimally configured saturable absorber capable to minimize the above-discussed problems.

SUMMARY OF THE INVENTION

The foregoing need is met by incorporating a passive modulator in the disclosed pulsed-operated multi-cascaded laser system. In particular, the passive modulator is configured as a saturated absorber (SA).

In accordance with one aspect the disclosed SA is configured with a specifically selected recovery time period "$\tau$". The closed or near-closed state of the SA between pulses, during which the propagation of light is suppressed, is achieved by configuring the SA with the recovery time period $\tau$ smaller than $1/f$, wherein f is a maximal pulse frequency. To further ensure the closed state of the SA, the recovery time period of the SA is smaller than a roundtrip time T corresponding to forward and backward propagation of radiation between adjacent gain blocks.

In accordance with a further aspect of the disclosure, a SA is configured as an output isolator. In this configuration, the configuration of the SA is optimized so that it substantially minimizes the propagation of backreflection which is unavoidable in the industrial environment.

Still a further aspect of the disclosure is concerned with a buildup of scattering noise, such as ASE, propagating through a pulsed system between consecutive pulses. The configuration of the output SA is optimized to block ASE from reaching a downstream gain block.

BRIEF DESCRIPTION OF THE DRAWINGS

FIG. 6 illustrates the transmissivity change in the saturable absorber in response to the square pulse of FIG. 5.

SPECIFIC DESCRIPTION

Figure 1:
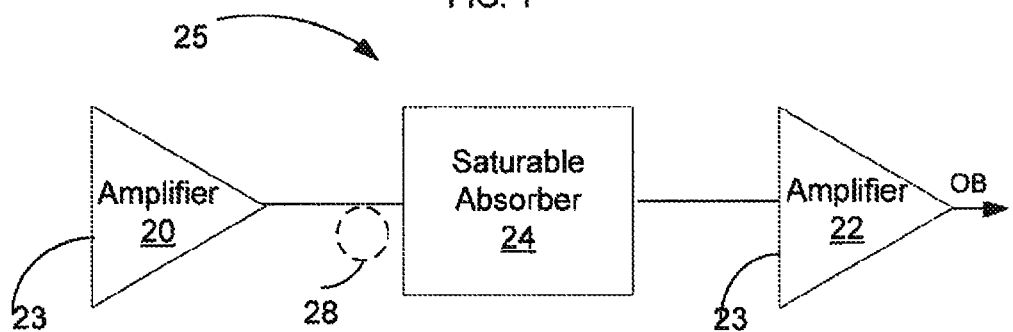
FIG. 1 is a diagrammatic view of one embodiment of the disclosure illustrating a saturable absorber which functions as an isolator.

Reference will now be made in detail to the disclosed system. Wherever possible, same or similar reference numerals are used in the drawings and the description to refer to the same or like parts or steps. The drawings are in simplified form and are far from precise scale.

FIG. 1 illustrates an optical pulsed system 25 including two or more optical amplifiers or gain blocks 20, 22. To increase the output power of gain blocks 20, 22, respectively, which is a current trend in the laser industry, the gain blocks each should be capable of storing as much energy as possible. Hence, the greater the stored energy, the greater the output power of the block. To provide for the effective operability of system 25, system 25 further includes at least one saturable absorber 24 coupled between output and input of respective blocks 20 and 22. In accordance with the disclosure, SA 24 has an optimal configuration for the effective optical isolation of gain blocks 20 and 22.

The principle of operation of SA 24 is based on the saturation of loss by ions implanted in accordance with known techniques. With light impinging on SA 24, it is absorbed by at least some ions located on the ground level which thereafter make transition to a higher level(s). However, the greater portion of light passes (is transmitted) through SA 24. With the intensity of light increasing, the population of exited ions is also increasing, the phenomenon known as bleaching or a SA open state. Accordingly, the open state is characterized by minimal absorption and power losses which the light pulse experiences while propagating through SA 24. The lower absorption, the lower losses, the higher the light transmission through SA 24.

Figure 3:
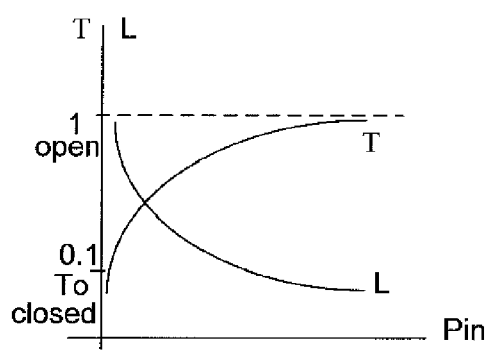
FIG. 3 is a graph illustrating the dependence of the absorber's transmissivity from an input power.
Figure 5:
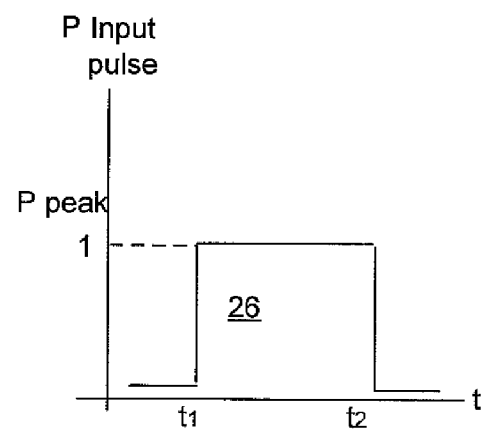
FIG. 5 illustrates a square pulse coupled in to the input of the absorber.
Figure 4:
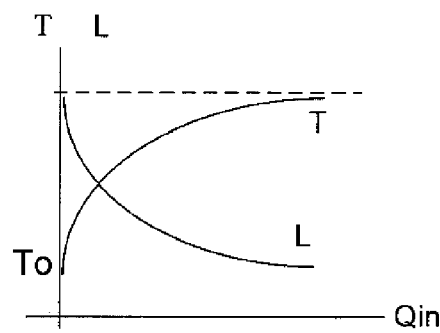
FIG. 4 is a graph illustrating the dependence of the absorber's transmissivity from an input energy.
Figure 7:
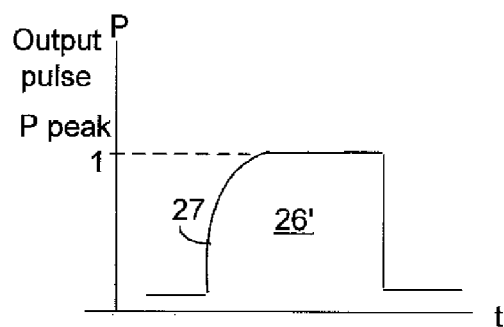
FIG. 7 illustrates the output pulse at the output of the absorber.

As illustrated in FIGS. 3 and 4, the absorption coefficient or percentage of light absorbed depends, among others, on the type of dopants and their characteristics and, of course, the input power/energy. As a pulse is coupled into the input of SA 24, initially its leading front experiences high losses. As the portion of absorbed energy in SA 24 increases, the transmission of light abruptly increases to its maximum while, of course, the losses decrease reaching its minimum. These conditions correspond to an open state of SA 24 and gain blocks 20 and 22 are optically coupled.

With the light intensity decreased, more and more previously exited ions return to the ground level. As a consequence, the transmission is gradually decreases and SA 24 assumes a closed state waiting for the next pulse. In this state, the light transmissivity $T_0$ through SA 24 should be substantially nonexistent. However, to operate in the desired open/closed sequence, SA 24 should be correctly configured.

Turning back to FIG. 1, typically, gain blocks 20 and 22 each are pumped to acquire a high gain factor G and, thus, to amplify a coupled pulse. If system 25 were configured without SA 24, the overall gain of system 25 would be the sum of gain factors $G_{20}$ and $G_{22}$ of respective gain blocks 20 and 22. However, in reality, any laser system is always associated with parasitic backreflection since light may bounce back upstream from any internal "impurity" such as miniscule defects within a gain block itself, surfaces of bulk elements, Rayleigh, Brilloun and other types of scattering, splices between fibers and etc. Thus, a combination of amplifying cascades or gain blocks 20, 22, respectively, always have a feedback forming a resonant cavity.

The presence of the resonant cavity poses a serious problem when its total losses exceed the gain (+dB) which the light experiences during its forward and reverse propagation or a round trip Tround_trip. Configuring a powerful laser system with minimal reflections which generate −dB compensation for the total gain is practically impossible. Accordingly, when laser system 25 is configured without SA 24, the total gain G (+dB) exceeds losses (−dB). As a consequence, system 25 becomes not a two gain block system, but a single laser generating unit. Accordingly, SA 24 should be configured so that it adds additional losses which, when added to the losses of the system without the absorber, will allows the losses exceed the gain. In this case, the generation does not occur.

The SA 24, thus, is configured so that it introduces sufficient losses all the time except for short period of time Topen when it is in the open state and its losses, thus, are practically nonexistent. Under certain conditions imposed upon Topen, as discussed hereinbelow, SA 24 is operative to prevent gain blocks 20 and 22 from generating light emission in the open state thereof. When SA 24 is switched to the open state, gain blocks 20 and 22 are already operating as a laser unit and start to generate emission. But to obtain the latter, it is necessary to have some time during which the emission is built. This time corresponds to a round trip (or trips) along a resonant cavity including gain blocks 20, 22 and can be determined as follows:

$$T\text{round\_trip} = 2*(L1+L2)*n/c \qquad (0)$$

where L1, L2—lengths of the upstream and downstream gain blocks 20 and 22, respectively, n—refractive index of an active media, c—speed of light in vacuum. Thus, SA 24 is configured so that Topen<Tround_trip. In this case, system 25 is incapable of becoming a laser and the presence of SA 24 is justified.

FIGS. 5-8 illustrate the operation of SA 24 in system 25 operating with square-shaped pulses 26 at the output of, for example, gain block 20 of FIG. 1. As disclosed above, the leading front of pulse 26 is substantially suppressed for a short period of time necessary to reduce the absorption and, thus, increase the transmission of light as shown in FIG. 6. Accordingly, the losses, which the leading front of pulse 26 experiences, are illustrated by a wing 27 of a pulse 26' at the output of SA 24 of FIG. 7. Once the transmission T reaches its maximum (1) (FIG. 6), the greater part of pulse 26 is losslessly transmitted as illustrated by output pulse 26' of FIG. 7.

Figure 8:
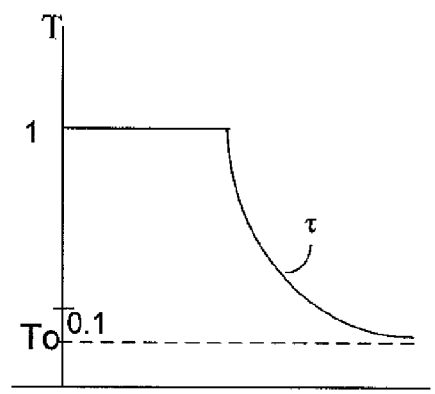
FIG. 8 illustrates the relaxation process in the absorber between adjacent pulses.

Referring to FIG. 8, as the pulse has passed through SA 24, the latter gradually assumes a closed state because exited ions require some time to return back to the ground level. The time, known as recovery time τ is, generally speaking, the time required for SA 24 to assume a fully or near closed state. The recovery time is thus an important parameter of SA 24, and as will be shown below, imposes certain restriction on the maximum frequency f of the pulse generation (pulse repetition rate PRR).

Figure 9:
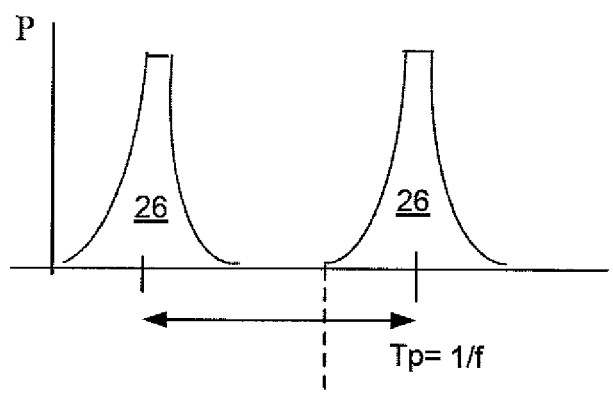
FIG. 9 illustrates a sequence of pulses coupled into the input of the disclosed saturable absorber.
Figure 10:
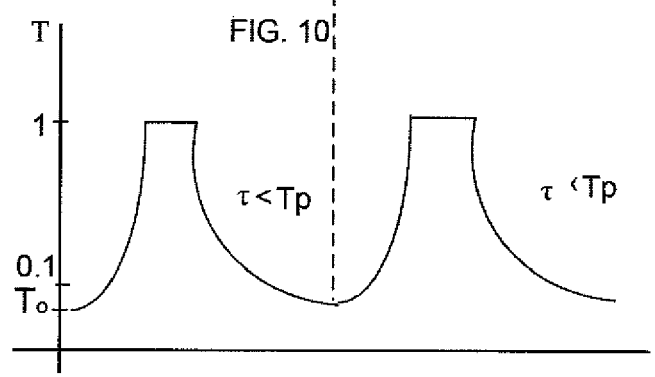
FIG. 10 illustrates the transmission process occurring in the disclosed saturable absorber in response to the sequence of pulses of FIG. 9

Referring to FIGS. 9 and 10, for SA to assume closed or near closed state, it should be configured so that τ<1/f (FIG. 9), where τ—the recovery time and f—pulse frequency (PRR). Otherwise, SA 24 cannot assume a closed or near closed state after leading pulse 26 has passed, and the absorption of SA 24, at the time trailing pulse 26 is coupled into the absorber's input, is lower than the absorption of SA 24 in its closed state at $T_0$ in FIG. 10. Thus, for recovery time τ of 1 microsecond [μs], a maximum pulse repetition rate (PRR) should not exceed about 1 MHz.

Furthermore, in accordance with this disclosure, SA 24 is configured so that its recovery time τ is smaller than the round trip time Tround_trip. The latter, of course, imposes limitations on the geometry of system 25, particularly if system 25 including SA 24 is configured as an all fiber system.

Typically, the length of fiber in system 25 configured in accordance with FIG. 1 varies between about 1 m and 10 m which corresponds to round trip time Tround_trip from about 10 nanoseconds to 100 nanoseconds. With a range of above-mentioned conventional lengths, the recovery time τ should also lie in a nanosecond diapason. To relax such a stringent time limitation, system 25 may have an additional fiber loop 28 (FIG. 1) configured from a passive (undoped) fiber. The addition of loop 26 around 100 m will increase the round trip time to about 1 microsecond. Hence, the length of fiber SA 24 should be taken into consideration to provide the effective isolation of gain blocks 20, 22, respectively.

The suitable configurations of the SA, besides fiber, may include, among others, semiconductor and other crystals. Other saturable absorbers may be configured from a length of fiber doped with ions. Fiber saturable absorbers are particularly advantageous because, in contrast to crystals, it is easy to select the desired absorption changing the length of the fiber.

One of the limitations of SA 24 affecting the effective isolation between gain blocks 20 and 22, respectively, relates to the energy of saturation Qsat. The saturation energy of the gain/loss medium is the energy of incident optical pulse which leads to a reduction in the gain/loss to 1/e (i.e. 37%) of its initial value. In accordance with the disclosure, the effective isolation occurs when SA 24 meets the following condition $$Q\text{sat\_sa} < Q\text{sat\_pa}$$

where Qsat_sa—the saturation energy of SA 24, Qsat_pa—the saturation energy of each gain block. If this condition is not met, then the losses of power in SA would be unjustifiably high. In other words, in order to compensate power losses of pulse 26 in SA 24, the gain factor of the gain block should be increased, but the absorption of SA in closed state (unsaturated absorption) could not compensate that gain increasing. In this case, the integration of SA 24 into system 25 would not make any sense. In short, the lower the saturation energy of SA 24, the smaller the losses in the SA. The saturation Qsat_sa of SA 24 can be affected by the type of dopants which may be selected from the group comprising ions of transition metals Cr and V, ions of Bi, ions of Sm and other suitable elements. In particular, the dopants are selected based on $\sigma_{es}$ и $\sigma_{as}$—cross-sections of emission and absorption, respectively, at the desired wavelength. Furthermore, saturation energy Qsat_sa is directly proportional to the active area of SA dopants multiplied by mode overlap factor.

Assume that the pulse energy at the output of gain block 20 and, thus, at the input of SA 24 is determined to be q, whereas the pulse energy at the output of SA 24 is $q_1$. If the relaxation time τ of SA 24 is substantially longer that the duration of the generated pulse, i.e., τ>T pulse, then, as the pulse passes through SA 24, the relaxation process may be neglected and, therefore, energies q и $q_1$ of pulse at the absorber input and output, respectively, relate to one another based on the known Frantz Nodvick equation:

$$q1 = Q\text{sat\_sa} \cdot \ln\left(T_0 \cdot \left(e^{\frac{q}{Q\text{sat\_sa}}} - 1\right) + 1\right) \quad (1)$$

$$Q\text{sat} = \frac{Shv}{\Gamma(\sigma_{es} + \sigma_{gs})} \quad (1.1)$$

where S—the square of active zone, $\sigma_{es}$ и $\sigma_{as}$—cross-sections of emission and absorption, respectively, $T_0$-unsaturated transmission, i.e. the transmission corresponded to closed state. Γ—overlapping factor between mode and active zone of SA From equation 1, the absorbed energy of the pulse can be determined as follows:

$$\Delta q = q - q1 \leq Q\text{sat\_sa} \cdot \ln\left(\frac{1}{T_0}\right) \quad (2)$$

When the saturation energy of absorber Qsat_sa is substantially smaller than the energy of pulse q at the input of SA 24, the energies of the pulse at the input and output of SA are substantially equal to one another. Based on equation (2), it is evident that the smaller Qsat_sa, the smaller the energy absorbed in SA 24, the faster SA 24 opens.

When the limitation τ>>Tpulse cannot be met, it is necessary to considerer the relaxation process in dynamic equations describing the saturation of the pulse. In this case, the saturation energy can be determined in accordance with the following equation:

$$\Delta q = q - q1 \leq Q\text{sat\_sa} \cdot \ln\left(\frac{1}{T_0}\right) \cdot \left(1 + \frac{T\text{pulse}}{\tau}\right) \quad (3)$$

The saturation energy Qsat_sa in fiber absorbers may be altered by modifying a central doping profile to a ring-shaped profile for a given mode filed diameter (MFD) The saturation energy Qsat_sa can also be altered by varying of MFD for given doping profile. The transmission coefficient $T_0$ (FIGS. 3, 4) in the closed state of SA 24 is independent from its saturation energy Qsat_sa and, in general, is selected based on specific requirements for the optical isolation between gain blocks of any given system configuration. For fiber SA, the logarithm of the transmission coefficient $T_0$ linearly depends from the length of the fiber and, thus, can be easily carried.

Up till now, the configuration of SA 24 has been considered without taking into consideration the possibility of the presence of small optical signals at the input of SA 24 in the closed state thereof. However, such a possibility is high and may affect the transmission coefficient $T_0$. One of the possibilities of amplified small signals may be amplified spontaneous emission from gain blocks 20, 22 (FIG. 1) (ASE).

The transmission coefficient T of the SA 24 in the closed state, as we expect, is close to the unsaturated coefficient $T_0$, However, it should be noted that the absorption of SA 24 in the closed state depends on the ASE at the input of SA 24 between consecutive pulses. To have the transmission T close to $T_0$, which would correspond to the absence of input power, the following condition has to be met:

$$P\_\text{ase} < P\_\text{sat\_sa}$$

where P_ase—mean power of ASE, a P_sat_sa=Qsat_sa/τ—is saturation power of the SA The overall gain factor G of system 25 during the closed state thereof is a function of $G_1 \cdot G_2 \cdot T_0$, where $G_1$ and $G_2$ are respective small signal gain factors of blocks 20, 22, and $T_0$ is an unsaturated transmission coefficient of SA 24. Accordingly, configuring SA 24 with a specifically selected transmission/absorption coefficient, the gain factor G of system 25 may be as small as desired.

As an example of the above, consider the amplification of nanosecond optical pulses ($T_{pulse}$=20 ns) with the initial energy of 0.1 μJ applied to an Yb gain block which outputs the pulse with the energy of 10 mJ at 1064 nm wavelength. An average gain factor of such an amplifier is about 50 dB. Due to the practical considerations in general and particularly because of backreflection that can easily reach a 50 dB level that provides for the self pulsing phenomenon, such a system should desirably have more than one amplification stage, for example, it may be system 25 of FIG. 1. The gain blocks 20 and 22, respectively, are isolated from one another by SA 24 which, for instance, is configured as a crystal $V^{3+}$:YAG. Assume that an unsaturated transmission coefficient is $T_0=10^{-5}$.

The following table illustrates basic spectroscopic parameters for the System 25 operating at 1064 nm wavelength.

| Qw | $\sigma_{es}$ | $\sigma_{gs}$ | T |
|---|---|---|---|
| $V^{3+}$:YAG | NA | $3.0*10^{-18}$ cm$^2$ | 20.0 ns |
| Yb:Ph | $1.3*10^{-21}$ cm$^2$ | $4.4*10^{-23}$ cm$^2$ | 1.4 ms |

Further assume that gain block 20 and block 22 are configured with respective core diameters $d\_{gb20}$=9 um, $d\_{gb22}$=70 um. To simplify the example, assume also that the overlap integral $\Gamma$=1.

The saturation energy Qsatsa of SA 24, upstream gain block 20 and downstream block 22 can be determined based on equation 1.1 and have the following respective values: Qsat_sa=0.58 uJ, Qsat_pa$_{20}$=88 uJ, Qsat_pa$_{22}$=5.3 mJ Using equation 3, the maximum energy absorbed in SA 24 will be Δq=13.3 uJ. Upon amplifying the energy of pulse in upstream gain block 20 up to q_pa$_{20}$=100 uJ, the part of energy that is lost in SA 24 will be 13.3 uJ: 100 uJ=0.133 (13.3%).

The following table illustrates the results of the necessary calculations:

|  | Input | PA20 | SA input | SA24 | SA output | PA22 | Output |
|---|---|---|---|---|---|---|---|
| Saturation energy |  | 88 uJ |  | 0.58 uJ |  | 5.3 mJ |  |
| Pulse energy | 0.1 uJ |  | 100 uJ |  | 86.7 uJ |  | 10 mJ |
| Average gain |  | 30 dB |  | N/A |  | 20.6 dB |  |
| Small signal gain |  | 32.7 dB |  | −50 dB |  | 25.3 dB |  |

As can be seen from the above, system 25 may have a gain factor of 32.7 dB-50 dB+25.3 dB=8 dB. The system may even have a negative gain factor, if the $T_0$ coefficient is sufficiently decreased.

Figure 2:
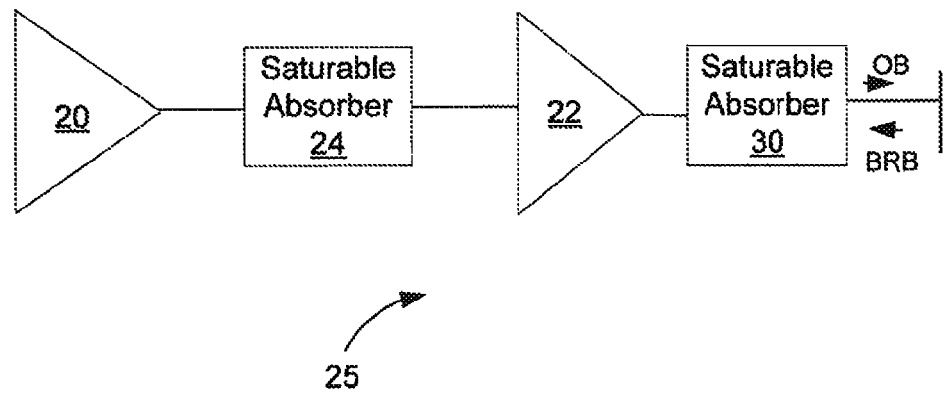
FIG. 2 is a diagrammatic view of a further embodiment with a saturable absorber configured to operate as a backreflection isolator.

FIG. 2 illustrates a further aspect of the disclosure, in accordance with which a SA 30 is configured to function as an output isolator operative to minimize and even eliminate backreflection which inevitably exists in practical applications of laser system 25. Similar to the SA disclosed in reference to FIG. 1, SA 30 is configured with a recovery time smaller than a round trip time necessary for a pulse to propagate from SA 30 towards an external surface and, upon being reflected, back to SA 30. The output SA 30 may be used simultaneously with SA 24, as shown in FIG. 1. Alternatively, output SA 30 may be used in laser systems which are not configured with interstage saturable absorbers.

Assume that SA 30 is also configured as crystal $V^{3+}$:YAG operative to isolate 10 mJ pulses in the forward direction. Assuming further that the backreflection impinging upon SA 30 constitutes about 1% of the energy carried by the output pulse. Accordingly, if the energy of the output pulse q=10 mJ, the energy of the backreflected signal $q_{back}$=10 mJ*0.01=0.1 mJ.

If the crystal is selected with the coefficient of unsaturated transmission $T_0=10^{-5}$ and the square S of the active zone is equal to the core diameter of downstream block 22, then the energy of saturation Qsat_sa=35.1 uJ. Using equation 1, the output pulse would loose only 4% while the losses in the backreflected pulse reach 42 dB.

Thus based on the disclosed technique for a saturable absorber, high power laser systems will be characterized by the following advantages:

a. a relative small gain coefficient of the entire system which provides for the improved reliability of gain blocks (in particular protects system from self-generation);
 b. substantially suppressed parasitic optical signals typically present in the closed state of the absorber and proportional to the total gain coefficient of the system which improves the effectiveness of output gain blocks; and
 c. a substantially decreased backreflection which allows for the improved safety of upstream components of the laser system and low power losses and stability of an optical pulse propagating in a forward directions.

It will be apparent to those skilled in the art that various modifications and variations can be made in the presently disclosed laser powerful system. For example, a laser system may have more than two gain blocks and, correspondently, have a saturable absorber between two adjacent gain blocks. Thus, it is intended that the present disclosure cover the modifications and variations of this disclosure provided they come within the scope of the appended claims and their equivalents.

The invention claimed is:

1. A multi-cascaded all fiber pulsed arrangement for amplifying optical discrete pulses generated by an external source and incident on an external surface, comprising:

upstream and downstream fiber amplifiers each operative to amplify the discrete pulses, a stretch of an optical path, including the upstream and downstream fiber amplifiers, being provided with internal impurities defining at least one parasitic resonant cavity therebetween;

at least one passive saturable absorber ("SA") located in the one parasitic cavity and coupled to output and input of respective upstream and downstream fiber amplifiers, the SA being configured with a recovery time $\tau_1$<Tround_trip, where $\tau$ is a recovery time of the SA, and Tround trip is a round-trip time of light within the one resonant cavity, the $\tau_1$ being selected to have Qsat_sa<Qsat_gb and to be sufficient to prevent emergence of self-pulsing effect in the fiber amplifiers, wherein Qsat_sa is a saturation energy of the SA and Qsat_gb is a saturation energy of fiber amplifiers; and an output saturable absorber ("OSA") located between the downstream amplifier and the external surface and configured with a recovery time $\tau_2 <$ Tround_trip_br with Tround_trip_br being a time which is necessary for a pulse to propagate towards and backwards between the OSA and the external surface, wherein the OSA substantially suppresses back-reflection of pulse originated downstream from the OSA.

2. The pulsed laser system of claim 1, wherein the SA is operative to have an open state, in which the upstream and downstream fiber amplifiers are optically coupled to one another, and a closed state, in which the fiber amplifiers are optically isolated, the SA being configured with a relaxation time $\tau < 1/f$ so as to assume the substantially closed state, wherein the f is a pulse repetition rate.

3. The pulsed laser system of claim 2, wherein the SA is operative to have an open state, in which the upstream and downstream fiber amplifiers are optically coupled to one another, and a closed state, in which the fiber amplifiers are optically isolated, the recovery time $\tau_1$ of the SA being selected so that the fiber amplifiers assume the substantially closed state.

4. The pulsed laser system of claim 2, wherein the SA is configured to have a power of saturation Psat_sa greater than a mean power of parasitic optical signals Pase which is coupled into the SA in the closed state thereof, wherein the Psat_sa is proportional to the saturation energy of the SA and inversely proportion to the recovery time.

5. The pulsed laser system of claim 1, wherein the SA is configured to have a closed state between consecutive optical pulses in which the SA absorbs an amplified spontaneous emission to isolate the fiber amplifiers from one another in the closed state.

* * * * *